United States Patent
Joshi et al.

(10) Patent No.: US 6,582,972 B1
(45) Date of Patent: Jun. 24, 2003

(54) LOW TEMPERATURE OXIDIZING METHOD OF MAKING A LAYERED SUPERLATTICE MATERIAL

(75) Inventors: Vikram Joshi, Colorado Springs, CO (US); Jolanta Celinska, Colorado Springs, CO (US); Narayan Solayappan, Colorado Springs, CO (US); Larry D. McMillan, Colorado Springs, CO (US); Carlos A. Paz de Araujo, Colorado Springs, CO (US); Koji Arita, Osaka (JP)

(73) Assignees: Symetrix Corporation, Colorado Springs, CO (US); Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/544,697

(22) Filed: Apr. 7, 2000

(51) Int. Cl.$^7$ ............................................. H01G 21/00
(52) U.S. Cl. ................................... 438/3; 438/240
(58) Field of Search .................... 438/3, 240, 444, 438/627, 690, 704, 724, 734, 757, 785, 117, 125, 232

(56) References Cited

U.S. PATENT DOCUMENTS

| | | | |
|---|---|---|---|
| 5,046,043 A | 9/1991 | Miller et al. | |
| 5,374,578 A | 12/1994 | Patel et al. | |
| 5,434,102 A | * 7/1995 | Watanabe et al. | 437/130 |
| 5,443,030 A | 8/1995 | Ishihara et al. | |
| 5,456,945 A | 10/1995 | McMillan et al. | |
| 5,466,629 A | 11/1995 | Mihara et al. | |
| 5,468,684 A | * 11/1995 | Yoshimori et al. | 437/228 |
| 5,508,226 A | 4/1996 | Ito et al. | |
| 5,519,234 A | * 5/1996 | Paz de Areaujo et al. | 257/295 |
| 5,523,964 A | 6/1996 | McMillan et al. | |
| 5,618,761 A | 4/1997 | Eguchi et al. | |
| 5,622,918 A | * 4/1997 | Nakamura | 505/473 |
| 5,728,603 A | 3/1998 | Emesh et al. | |
| 5,803,961 A | 9/1998 | Azuma et al. | |
| 5,824,590 A | 10/1998 | New | |
| 5,997,642 A | 12/1999 | Solayappan et al. | |
| 6,051,858 A | * 4/2000 | Uchida et al. | 257/295 |
| 6,056,994 A | * 5/2000 | Paz de Araujo et al. | 427/96 |
| 6,096,434 A | * 8/2000 | Yano et al. | 428/446 |
| 6,151,240 A | * 11/2000 | Suzuki | 365/145 |
| 6,207,465 B1 | * 3/2001 | Cuchiaro et al. | 438/3 |
| 6,269,109 B1 | * 7/2001 | Jewell | 372/43 |

FOREIGN PATENT DOCUMENTS

| | | |
|---|---|---|
| EP | 0950727 A1 | 10/1999 |
| JP | 5-195232 A | 8/1993 |
| JP | 10-182300 A | 7/1998 |
| JP | 11-228113 A | 8/1999 |

OTHER PUBLICATIONS

Russell; III–V Compound Smeiconductor Native Oxides—The Newest of the Semiconductor Device Materials; pp. 32–34; Compund Semiconductor Jan./Feb. 1997.*

* cited by examiner

Primary Examiner—Olik Chaudhuri
Assistant Examiner—Fernando Toledo
(74) Attorney, Agent, or Firm—Patton Boggs LLP (57) ABSTRACT

A thin film of precursor for forming a layered superlattice material is applied to an integrated circuit substrate, then a strong oxidizing agent is applied at low temperature in a range of from 100° C. to 300° C. to the precursor thin film, thereby forming a metal oxide thin film. The strong oxidizing agent may be liquid or gaseous. An example of a liquid strong oxidizing agent is hydrogen peroxide. An example of a gaseous strong oxidizing agent is ozone. The metal oxide thin film is crystallized by annealing at elevated temperature in a range of from 500° C. to 700° C., preferably not exceeding 650° C., for a time period in a range of from 30 minutes to two hours. Annealing is conducted in an oxygen-containing atmosphere, preferably including water vapor. Treatment by ultraviolet (UV) radiation may precede annealing. RTP in a range of from 500° C. to 700° C. may precede annealing.

28 Claims, 5 Drawing Sheets

LOW TEMPERATURE OXIDIZING METHOD OF MAKING A LAYERED SUPERLATTICE MATERIAL

BACKGROUND OF THE INVENTION

1. Field of the Invention

The invention in general relates to the fabrication of layered superlattice materials, and more particularly to a fabrication method that provides ferroelectric integrated circuit devices containing thin films of layered superlattice materials possessing high-polarizability, good coercive field values, and low-leakage current characteristics by using a low-temperature strong oxidizing agent, which decreases exposure to high temperatures and to oxygen at high temperatures during crystallization heating.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. U.S. Pat. No. 5,434,102, issued Jul. 18, 1995, to Watanabe et al., and U.S. Pat. No. 5,468,684, issued Nov. 21, 1995, to Yoshimori et al., describe processes for integrating these materials into practical integrated circuits. Layered superlattice materials exhibit characteristics in ferroelectric memories that are orders of magnitude superior to those of PZT and PLZT compounds.

A typical ferroelectric memory in an integrated circuit contains a semiconductor substrate and a metal-oxide semiconductor field-effect transistor (MOSFET) electrically connected to a ferroelectric device, usually a ferroelectric capacitor. Layered superlattice materials currently in use and development comprise metal oxides. In conventional fabrication methods, crystallization of the metal oxides to produce desired electronic properties requires heat treatments in oxygen-containing gas at elevated temperatures. The heating steps in the presence of oxygen are typically performed at a temperature in the range of 800° C. to 900° C. for 30 minutes to two hours. As a result of the presence of reactive oxygen at elevated temperatures, numerous defects, such as dangling bonds, are generated in the single crystal structure of the semiconductor silicon substrate, leading to deterioration in the electronic characteristics of the MOSFET. Good ferroelectric properties have been achieved in the prior art using process heating temperatures at about 700° C. to crystallize layered superlattice material. See U.S. Pat. No. 5,508,226, issued Apr. 16, 1996, to Ito et al. Nevertheless, the annealing and other heating times in the low-temperature methods disclosed in the prior art are in the range of three to six hours, which may be economically unfeasible. More importantly, the long exposure times of several hours in oxygen, even at the somewhat reduced temperature ranges, result in oxygen damage to the semiconductor substrate and other elements of the CMOS circuit.

After completion of the integrated circuit, the presence of oxides may still cause problems because oxygen atoms from a thin film of metal oxide layered superlattice material tend to diffuse through the various materials contained in the integrated circuit and combine with atoms in the substrate and in semiconductor layers, forming undesired oxides. The resulting oxides interfere with the function of the integrated circuit; for example, they may act as dielectrics in the semiconducting regions, thereby forming virtual capacitors. Diffusion of atoms from the underlying substrate and other circuit layers into the ferroelectric metal oxide is also a problem; for example, silicon from a silicon substrate and from polycrystalline silicon contact layers is known to diffuse into layered superlattice material and degrade its ferroelectric properties. For relatively low-density applications, the ferroelectric memory capacitor is separated from the CMOS circuit by a thick interlayer dielectric and is displaced to the side of the underlying CMOS circuit, and this may reduce somewhat the problem of undesirable diffusion of atoms between circuit elements. Nevertheless, as the market demand and the technological ability to manufacture high-density circuits increase, the distance between circuit elements decreases, and the problem of molecular and atomic diffusion between elements becomes more acute. To achieve high circuit density by reducing circuit area, the ferroelectric capacitor of a memory cell is placed virtually on top of the switch element, typically a field-effect transistor (hereinafter "FET"), and the switch and bottom electrode of the capacitor are electrically connected by a conductive plug. To inhibit undesired diffusion, a barrier layer is located under the ferroelectric oxide, between the capacitor's bottom electrode and the underlying layers. The barrier layer not only must inhibit the diffusion of oxygen and other chemical species that may cause problems; it must also be electrically conductive, to enable electrical connection between the capacitor and the switch. The maximum processing temperature allowable with current barrier technology is about 700° C. At temperatures above 700° C., the highest-temperature barrier materials degrade and lose their diffusion-barrier properties. On the other hand, the minimum feasible manufacturing process temperatures of layered superlattice materials used in the prior art is about 800° C., which is the temperature at which deposited layered superlattice materials, such as strontium bismuth tantalate, are annealed to achieve good crystallization.

For the above reasons, therefore, it would be useful to have a low-temperature method for fabricating layered superlattice materials in ferroelectric integrated circuits that minimizes the time of exposure to oxygen at elevated temperature, as well as reduces the maximum temperatures used.

SOLUTION

The embodiments of the present invention reduce fabrication processing temperatures and reduce the time of exposure of the integrated circuit to oxygen or other oxidizing gas at elevated temperature, that is, in the range of 500° C. to 700° C., while virtually eliminating heating of the integrated circuit at excessive temperatures, above 700° C.

Layered superlattice materials are metal oxides. An important feature of a method in accordance with the invention is the use of a strong oxidizing agent, or oxygen gas at a pressure greater than atmospheric pressure, during fabrication of a thin film of layered superlattice material. The term "strong oxidizing agent" herein means a substance that provides oxygen more readily than molecular oxygen gas, i.e., $O_2$. The strong oxidizing agent serves to provide oxygen to a precursor thin film on an integrated circuit substrate. The oxygen is incorporated into the precursor thin film to enhance formation of metal oxide layered superlattice material. A precursor thin film, either liquid or solid, may be deposited on the integrated circuit substrate by a variety of techniques, including liquid spin-on, liquid-source misted chemical deposition ("LSMCD"), or metal organic chemical vapor deposition ("MOCVD") methods.

In a method in accordance with the invention, a strong oxidizing agent is applied to a precursor thin film. It is a feature of the invention that the strong oxidizing agent is applied to the precursor thin film at a relatively low temperature. This is done for several reasons. Low temperature oxidation of the precursor thin film avoids oxidation damage of the semiconductor material or other elements of the integrated circuit that may occur under oxidizing conditions at the higher temperatures and longer heating times used in conventional methods. Also, the level of oxidation in the precursor thin film is thereby increased at the lower temperatures, before crystallization of the thin film at elevated temperature to form metal oxide layered superlattice material. As a result, the electronic characteristics of the layered superlattice material are improved compared to layered superlattice material that undergoes oxidation during crystallization at elevated temperature.

A method of fabricating a thin film of layered superlattice material in an integrated circuit in accordance with the invention comprises: providing a precursor containing metal moieties in effective amounts for forming a layered superlattice material upon heating the precursor; applying the precursor to a substrate to form a precursor thin film; and exposing the precursor thin film to a substance selected from the group consisting of a strong oxidizing agent and oxygen at elevated pressure to form a metal oxide thin film. The strong oxidizing agent may be liquid or gaseous in the various embodiments. An example of a liquid strong oxidizing agent is hydrogen peroxide. If a liquid precursor is used, a thin film of the liquid precursor is heated at a low temperature, preferably in the range of 100° C. to 300° C., and most preferably about 160° C., to dry it before applying the strong oxidizing agent. An example of a gaseous strong oxidizing agent is ozone. A gaseous strong oxidizing agent may be applied by heating the precursor thin film at a low temperature in a gaseous atmosphere containing the strong oxidizing agent.

Crystallization of the metal oxide thin film to form the polycrystalline layered superlattice material typically includes a step of annealing the metal oxide thin film at elevated temperature in a range of from 500° C. to 700° C., preferably not exceeding 650° C., for a time period in a range of from 30 minutes to two hours. Annealing is conducted in an oxygen-containing atmosphere, preferably including water vapor. An embodiment may further comprise a step of treating the metal oxide thin film with ultraviolet (UV) radiation before the step of annealing. A method also preferably includes a step of conducting an RTP at elevated temperature in a range of from 500° C. to 700° C. before the step of annealing.

A method in accordance with the invention enhances oxidation of precursors of layered superlattice materials and suppresses occurrence of the fluorite phase during crystallization. Crystallization at temperatures of about 650° C. reduce oxygen damage of the integrated circuit, and allow use of preferred materials, such as TiN and TaN barrier layers. Thin films fabricated using methods in accordance with the invention have good ferroelectric and electronic properties, including good measured values of polarizability, coercive field, leakage current, fatigue, imprint and retention characteristics.

In another feature of the invention, crystallization of a desired layered superlattice material is enhanced by the presence of water vapor in during the heating process.

Preferably, the water vapor is present in the oxygen gas atmosphere or the strong oxidizing gas atmosphere in which an integrated circuit substrate is heated.

Numerous other features, objects and advantages of the invention will become apparent from the following description when read in conjunction with the accompanying drawings.

DETAILED DESCRIPTION OF THE PREFERRED EMBODIMENT

1. Overview

In a first principal embodiment of a method in accordance with the invention, a precursor thin film is exposed to a liquid strong oxidizing agent, typically after all or a substantial part of a solid precursor thin film has been formed on the substrate. The liquid strong oxidizing agent may be a liquid solution containing an oxidant compound dissolved in a solvent. The oxidant compound is selected to be highly oxidizing; for example, hydrogen peroxide, $H_2O_2$. The solvent is selected to be a good wetting agent. Wetting agent solvents for $H_2O_2$ solutions include ethanol, methanol and water. The precursor film is usually heated at a low temperature, typically in a range of from 100° C. to 400° C., before application of the strong oxidizing agent. The heating at low temperature, often referred to as baking or drying, tends to decompose precursor compounds in the thin film, and to drive off volatile components of precursor compounds from the precursor thin film. In an embodiment using a liquid deposition technique, a liquid precursor thin film containing metal organic precursor compounds dissolved in a liquid organic solvent is dried to form a solid precursor thin film. Heating of the liquid precursor thin film, therefore, also serves to volatilize and drive off the organic solvent before the strong oxidizing agent is applied. After heating (baking, drying) at low temperature, the solid precursor thin film contains metal atoms that were initially included in the metal organic precursor compounds, which were decomposed by the heating. The metal atoms are present in relative amounts corresponding to a stoichiometric formula for the desired layered superlattice material to be formed; but the metal atoms do not yet exist in the desired polycrystalline layered superlattice structure.

After application of a liquid strong oxidizing agent, the wafer substrate, including the solid precursor thin film and the liquid strong oxidizing agent, is heated at low temperatures for several minutes, typically using a hot plate. The wetting agent solvent is thereby evaporated, and the low-temperature heating of the oxidant compound enhances oxidation of the metal atoms present in the solid precursor thin film, resulting in a solid metal oxide thin film.

In a second principal embodiment of a method in accordance with the invention, a liquid or solid precursor thin film is exposed to a gaseous strong oxidizing agent, either during deposition of the liquid precursor thin film, after all or a substantial part of a liquid precursor thin film has been formed on the substrate, or after a solid material has been formed on the substrate. The gaseous strong oxidizing agent may be included in the gaseous atmosphere of an LSMCD deposition chamber. More typically, however, the gaseous strong oxidizing agent is included in the gaseous atmosphere in which the precursor thin film is dried and baked. The gaseous oxidant is selected to be highly oxidizing; for example, ozone gas, $O_3$. The liquid precursor film is typically deposited on the integrated circuit substrate at room temperature. After deposition of the liquid precursor film is completed, it is usually dried and baked by heating at a low temperature, typically in a range of from 100° C. to 300° C., in a strong oxidizing atmosphere containing a gaseous strong oxidizing agent, such as ozone. The heating at low temperature tends to volatilize and drive off organic solvents, decompose precursor compounds in the thin film, drive off volatile components of precursor compounds from the precursor thin film, and oxidize the remaining metal atoms. The solid precursor thin film is heated at low temperatures for several minutes, typically using a hot plate. The gaseous strong oxidizing agent typically is also present during this heating step, but may not be. The low-temperature heating of the oxidant compound enhances oxidation of the metal atoms present in the solid precursor thin film, resulting in a solid metal oxide thin film. The resulting oxidized solid precursor thin film contains metal atoms that were initially included in the metal organic precursor compounds, which were decomposed by heating. The metal atoms are present in relative amounts corresponding to a stoichiometric formula for the desired layered superlattice material to be formed; but the metal atoms do not yet exist in the desired polycrystalline layered superlattice structure.

In a third principal embodiment of a method in accordance with the invention, a precursor thin film formed by a CVD deposition technique is strongly oxidized. It may be strongly oxidized by adding a strongly oxidizing gas to a CVD reaction chamber during deposition of the precursor thin film; or it may be oxidized by using either a liquid or a gaseous strong oxidizing agent after CVD deposition of the precursor thin film.

In a fourth principal embodiment of the invention, a thin film of a precursor, either liquid or solid, on a substrate is heated in a pressurized oxygen environment. The term "pressurized oxygen environment" means that the oxygen containing gas in which the substrate is heated is at a pressure higher than atmospheric pressure. Preferably, the pressure is at least 1.25 atmospheres, and most preferably, two atmospheres or twice atmospheric pressure.

The heating of a precursor thin film or metal-containing thin film in a baking or drying step at low temperature is not uncommon in the prior art; but the novel use of a strong oxidizing agent in combination with low-temperature heating, in accordance with the invention, enhances the oxidation of the metal atoms in the precursor thin film. The enhanced oxidation of the metal atoms in the thin film has several desirable results. It is not necessary to heat the integrated circuit substrate including the solid metal oxide thin film at excessive temperatures above 700° C. in the presence of oxygen. Instead, it is possible to achieve desired crystallization of the oxidized metal atoms in the thin film through heat treatment at an elevated temperature in a range of from 500° C. to 700° C. in the presence of oxygen, usually for a total heating time not exceeding two hours. Thin films of layered superlattice material formed in accordance with the invention also have improved electronic characteristics compared to thin films made without using an oxidation agent at low temperature. In particular, dielectric or ferroelectric layered superlattice material fabricated using a method in accordance with the invention displays low leakage current when tested at applied voltages typical for integrated circuit operation.

In a further embodiment of a method in accordance with the invention, the wafer substrate including the solid metal oxide thin film is treated using UV radiation after it has been exposed to the strong oxidizing agent and heated, but before heat treatment at elevated temperatures. The UV radiation tends to result in improved electronic characteristics of the layered superlattice material; in particular, it results in reduced leakage current through the thin film of layered superlattice material.

Generally, after oxidation treatment at ambient or low temperature as described above, whether with UV treatment or not, the substrate including the solid metal oxide thin film is treated by heating at elevated temperature in the presence of oxygen. Heat treating typically includes furnace annealing or rapid thermal treatment ("RTP") or both. Preferably, an RTP is performed at a maximum hold temperature of 700° C. for thirty seconds, followed by a furnace anneal at 650° C. for 90 minutes. It is believed that the RTP treatment enhances initial formation of the ferroelectric polycrystalline phase in the layered superlattice material, and thereby avoids or minimizes formation of the non-ferroelectric fluorite phase in the thin film of metal oxides. The RTP is conducted in an oxygen-containing atmosphere. In certain embodiments, the RTP may be conducted in an atmosphere containing ozone or other strong oxidizing gas.

A feature in certain embodiments of a method in accordance with the invention is the novel use of water vapor present during heat treatment of the thin film, preferably in oxidizing gas, preferably at elevated temperature. Typically, "wet oxygen gas" is used during heat treatment of the precursor thin film in oxygen at elevated temperature. In one embodiment, oxygen gas is bubbled through water at a water-vaporizing temperature of 75° C. or greater, and preferably about 95° C. at ambient pressure. The humidified "wet oxygen gas" enters an oxygen annealing furnace in which the substrate wafer containing the thin film is annealed to effect crystallization of the precursor thin film. In such embodiments, therefore, the oxygen-containing atmosphere in the annealing furnace also contains water vapor. The presence of water vapor tends to improve the electronic characteristics of the resulting thin film of layered superlattice material, as well as avoid oxidation damage of the semiconductor material and other elements of the integrated circuit. Water vapor suppresses formation of the non-perovskite, nonferroelectric fluorite phase in favor of the desired ferroelectric polycrystalline perovskite-like structure of a layered superlattice material.

As already mentioned, in a method in accordance with the invention, formation of the desired polycrystalline layered superlattice phase to achieve desired electronic characteristics, such as ferroelectric polarizability, usually requires annealing at elevated temperature. In this specification, elevated temperature means a temperature in a range of from 500° C. to 700° C., usually at least 600° C., but more typically in a range of from 650° C. to 700° C.

Ferroelectric layered superlattice materials, like the metal oxides $SrBi_2Ta_2O_9$ (SBT) and $SrBi_2(Ta_{1-x}Nb_x)_2O_9$ (SBTN), where $0 \leq x \leq 1$, are particularly useful in nonvolatile memory applications, such as in FeRAMs and nondestructible read-out ferroelectric FETs. Polycrystalline thin films of these layered superlattice materials, as well as other layered superlattice materials, may be fabricated in accordance with the invention.

After annealing at elevated temperature in an oxidizing gas to crystallize the metal oxides in the thin film, resulting in formation of the thin film of layered superlattice material, the usual post-processing steps may be conducted to complete the integrated circuit, but preferably at temperatures not exceeding 700° C.

In one aspect of the invention, the substrate comprises a first electrode, and the method includes steps of forming a second electrode on the thin film of layered superlattice material to form a memory capacitor, and subsequently performing a step of post-annealing. In a preferred embodiment, the first electrode and the second electrode contain platinum and titanium. The post-anneal is conducted at a temperature in the range of from 500° C. to 700° C., preferably at a temperature not exceeding the temperature of the crystallization anneal. In one embodiment of the invention, the post-annealing is conducted in an oxidizing gas, typically an oxygen-containing ambient, and usually in $O_2$ gas. Preferably, an electrically conductive barrier layer is formed on the substrate prior to applying the precursor coating.

The thin film of layered superlattice material typically has a thickness in a range of from 20 nm to 500 nm, preferably from 40 nm to 200 nm.

Figure 1:
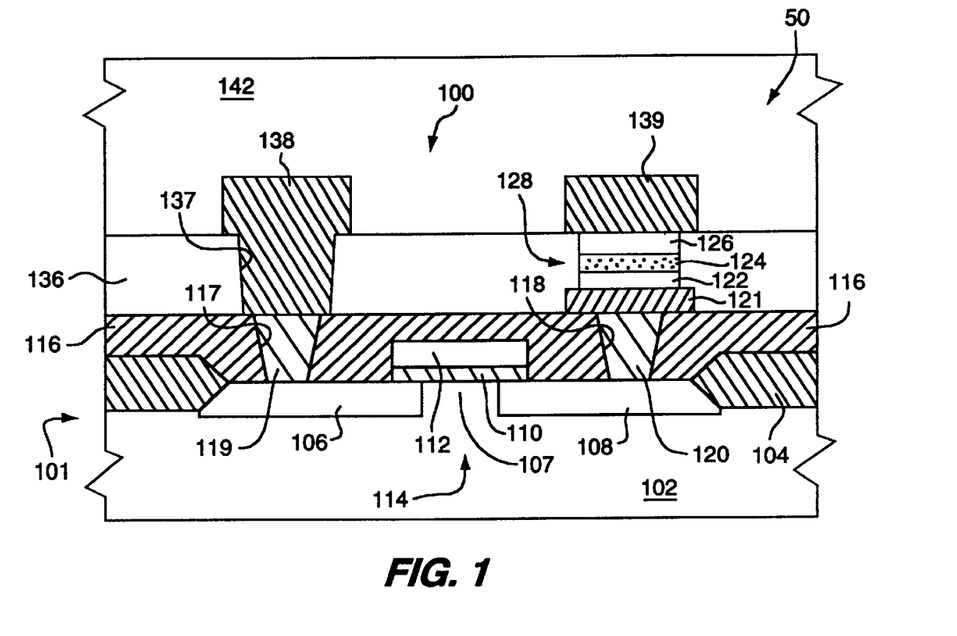
FIG. 1 is a schematic of a cross-sectional view of a portion of an integrated circuit as may be fabricated by the method of the invention showing a nonvolatile ferroelectric memory cell in which the capacitor is located above the switch.
Figure 2:
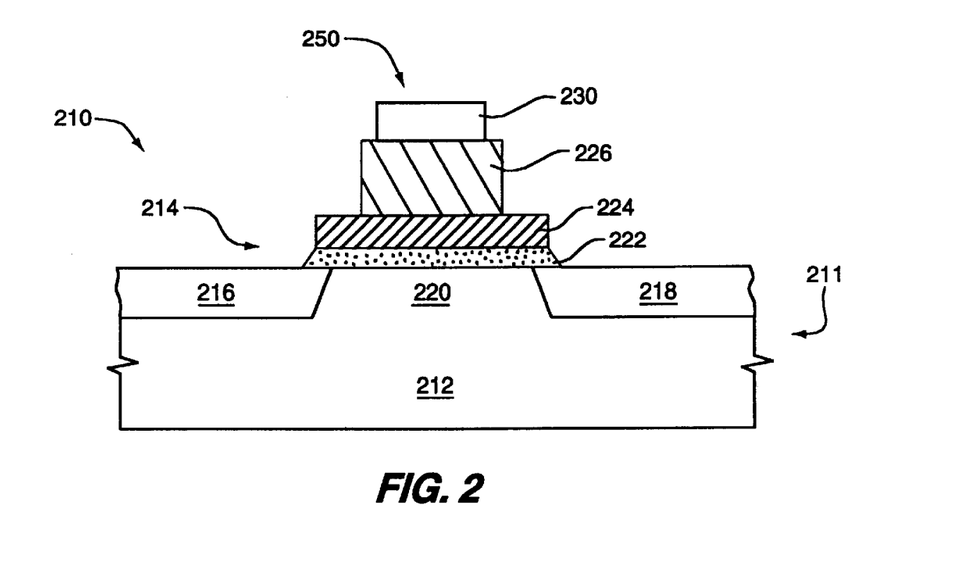
FIG. 2 shows a cross-sectional view of a portion of a ferroelectric FET memory that may be fabricated using a method in accordance with the invention.

It should be understood that FIGS. 1 and 2, depicting integrated circuit devices, are not meant to be actual plan or cross-sectional views of any particular portion of actual integrated circuit devices. In actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric and dielectric devices that could be fabricated using the method of the invention. For example, FIG. 1 depicts a portion of a ferroelectric memory 100 containing a switch in the form of a field effect transistor 114 in electrical connection with a ferroelectric capacitor 128. Although the ferroelectric element 124 depicted in FIG. 1 is substantially above the switch element 114, the invention may be used, for example, to fabricate a thin film of layered superlattice material in an element displaced to the side of the switch. In addition, a method in accordance with the invention may also be used to fabricate a ferroelectric FET memory in which the ferroelectric element comprising layered superlattice material is incorporated in the switch element. Such a ferroelectric FET, as depicted in FIG. 2, was described in McMillan, U.S. Pat. No. 5,523,964, issued Jun. 4, 1996, and U.S. patent application Ser. No. 09/365,628 filed Aug. 2, 1999, which are hereby incorporated by reference as if fully disclosed herein.

FIG. 1 shows a cross-sectional view of an exemplary nonvolatile ferroelectric memory 100 fabricated in accordance with the invention. The general manufacturing steps for fabricating integrated circuits containing MOSFETs and ferroelectric capacitor elements are described in Mihara, U.S. Pat. No. 5,466,629, and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

FIG. 1 shows a memory cell 50 of a ferroelectric random access integrated circuit memory 100. Memory cell 50 includes a transistor switch 114 and a capacitor 128 formed on a semiconductor wafer 101. In the embodiment shown, transistor 114 is a MOSFET and includes source region 106, drain region 108, a channel region 107, gate insulating layer 110 and gate electrode 112. Capacitor 128 includes bottom electrode 122, ferroelectric layer 124, and top electrode 126. A field oxide region 104 is formed on a surface of a silicon substrate 102. Source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110.

A first interlayer dielectric layer (ILD) 116 made of BPSG (boron-doped phospho-silicate glass) is formed on substrate 102 and field oxide region 104. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10 nm to 20 nm. Diffusion barrier layers, such as titanium nitride, inhibit the diffusion of chemical species between the underlying and overlying layers of the memory 100.

As depicted in FIG. 1, a bottom electrode layer 122 made of platinum and having a thickness of 100 nm is deposited on diffusion barrier layer 121. Then a ferroelectric thin film 124 of layered superlattice material is formed in accordance with the invention on bottom electrode layer 122. A top electrode layer 126, made of platinum and having a thickness of 100 nm, is formed on ferroelectric thin film 124.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138 and top electrode wiring 139. Wirings 138, 139 preferably comprise Al—Si—Cu standard interconnect metal with a thickness of about 200 nm to 300 nm.

FIG. 2 shows a cross-sectional view of a portion of a ferroelectric FET integrated circuit memory 210 as may be fabricated using a method in accordance with an embodiment of the invention. Integrated circuit memory 210 comprises a ferroelectric FET 250 formed on a wafer 211, comprising a standard semiconductor material 212, preferably a p-100 silicon material. A semiconductor substrate 214 comprises a highly doped source region 216 and a highly doped drain region 218, which are formed about a doped channel region 220. Doped source region 216, drain region 218 and channel region 220 are preferably n-type doped regions, but also may be p-type regions formed in an n-type semiconductor. Semiconductor substrate 214 typically also includes a gate oxide 222, located usually above channel region 220, but which can extend beyond channel region 220 to cover parts of source region 216, drain region 218 and other parts of semiconductor material 212. Typically, gate oxide 222 is formed from the semiconductor material 212 during high temperature process steps. When the semiconductor material 212 is silicon, then gate oxide 222 usually comprises silicon dioxide. An interface insulator layer 224 may be formed above semiconductor substrate 214 above channel 220, usually on gate oxide 222. A ferroelectric thin film 226, formed in accordance with the invention, is located above interface insulator layer 224 and channel region 218, usually on interface insulator layer 224. Gate electrode 230 is formed above ferroelectric thin film 226, usually on ferroelectric thin film 226. Semiconductor substrate 214, including source region 216, drain region 218, channel region 220, and gate oxide 222, together with interface insulator layer 224, ferroelectric thin film 226 and gate electrode 230 form ferroelectric FET memory 210. Typically, memory 210 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

U.S. Pat. No. 5,519,234 issued May 21, 1996, to Carlos A. Paz de Araujo et al., is hereby incorporated herein by reference as though fully disclosed herein, and discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995, to Watanabe et al., and U.S. Pat. No. 5,468,684 issued Nov. 21, 1995, to Yoshimori et al., also both hereby incorporated by reference as though fully disclosed herein, describe processes for integrating these materials into practical integrated circuits.

The layered superlattice materials may be summarized generally under the formula:

$$A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-q}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U.S. Pat. No. 5,519,234 issued May 21, 1996, referenced above. The layered superlattice materials do not include every material that can befit into Formula (1), but only those which spontaneously form themselves into crystalline structures with distinct alternating layers.

U.S. Pat. No. 5,803,961, issued Sep. 8, 1998, to Azuma et al., which is hereby incorporated herein by reference as though fully disclosed herein, discloses that mixed layered superlattice materials, such as strontium bismuth tantalum niobate, can have even more improved properties in ferroelectric applications. The mixed layered superlattice materials are characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_c O_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$ (SBTN), are being used and are under further development for use as capacitor dielectric in nonvolatile memory applications, such as in FeRAMs and nondestructible read-out ferroelectric FETs. Polycrystalline thin films of these layered superlattice materials, as well as other layered superlattice materials represented by Formula (1), may be fabricated and used in accordance with the invention.

The word "substrate" can mean the underlying semiconductor material 102, 212 on which the integrated circuit is formed, as well as any object on which a thin film layer is deposited. In this disclosure, "substrate" shall generally mean the object to which the layer of interest is applied. For example, when we are talking about a ferroelectric thin film 124 of FIG. 1, the substrate on which it is formed may include various elements, in particular, bottom electrode 122. The term "semiconductor substrate" is more specific than substrate. For example, as used in FIG. 2, "semiconductor substrate 214" refers to those elements of the circuit having origins in the original semiconductor material of the starting wafer, such as from the p-100 crystalline silicon material 212 of FIG. 2. Thus, in the example of the structure of FIG. 2, "semiconductor substrate 214" includes elements 212, 216, 218, 220.

The long dimensions of semiconductor substrate 214 and semiconductor material 102 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction.

Terms of orientation herein, such as "above", "top", "upper", "below", "bottom" and "lower", mean relative to the substrate 102, 214. That is, if a second element is "above" a first element, it means it is farther from the semiconductor substrate 102, 214; and if it is "below" another element, then it is closer to the semiconductor substrate 102, 214 than the other element. Terms such as "above" and "below" do not, by themselves, signify direct contact. However, terms such as "on" or "onto" do signify direct contact of one layer with an underlying layer.

The term "thin film" is used herein as it is used in the integrated circuit art. Generally, it means a film of less than a micron in thickness. The thin films disclosed herein are typically less than 500 nm in thickness. A thin film of layered superlattice material fabricated by a method in accordance with the invention typically has a final thickness in a range of from 20 nm to 500 nm, preferably in a range of from 40 nm to 200 nm. These thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The word "precursor" used herein can mean a fluid containing one metal organic solute that is mixed with other precursors to form intermediate precursors or final precursors, or it may refer to a final precursor fluid, that is, the fluid to be applied to a particular surface during fabrication. The precursor as applied to the substrate is usually referred to as the "final precursor", "precursor mixture", or simply "precursor". In any case, the meaning is clear from the context.

A "precursor compound" in this disclosure refers to a metal organic compound containing at least one metal that is included in the desired layered superlattice material of the thin film formed in accordance with the invention. The metal organic precursor compounds disclosed herein are useful because they can be easily dissolved in organic liquid precursor solutions, which can be stored until used. In a preferred liquid-source misted chemical deposition ("LSMCD") method in accordance with the invention, one or more liquid precursor solutions are atomized to form a mist that contains precursor compounds suitable for formation of the desired thin film. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art. Thin film layers formed in accordance with the invention have smooth, continuous and uniform surfaces, and they can be reliably fabricated to have thicknesses in the range of from 40 nm to 500 nm, maintaining important structural and electrical characteristics.

It should be understood that the specific processes and electronic devices described herein are exemplary; that is, the invention contemplates that the layers in FIGS. 1 and 2 may be made of many other materials than those mentioned above and described below. There are many other variations of the method of the invention than can be included in a document such as this, and the method and materials may be used in many other electronic devices other than integrated circuit devices 100 and 210.

Terms such as "heating", "drying", "baking", "rapid thermal process" ("RTP"), "furnace anneal", and others all involve the application of heat. For the sake of clarity, the various terms are used in the art to distinguish certain techniques and method steps from one another. Nevertheless, it is clear that similar techniques may be used to accomplish differently named process steps; for example, drying, baking and furnace annealing may typically be accomplished using the same apparatus, the only differences being their function and position in a fabrication sequence, or the particular temperatures used. As a result, it would be possible to designate an annealing step as a heating step, or a drying step as a baking step. To avoid confusion, therefore, the general term "heating" may also be used to describe a fabrication step. A rapid thermal processing (RTP) technique in accordance with the invention is distinct from other heating techniques in being characterized by a very rapid rise in temperature, typically at an actual ramping rate of 10° C. to 100° C. per second. It is further understood that one skilled in the art may accomplish a desired process result using heat as disclosed herein, while referring to the process with a term different from the one used herein.

In this specification, "elevated temperature" means a temperature in a range of from 500° C. to 700° C., usually at least 600° C., but more typically in a range of from 650° C. to 700° C. The term "excessive temperature" refers to a temperature in excess of 700° C. The term "low temperature" refers to a temperature not exceeding 500° C., usually less than 400° C., and preferably in a range of from 100° C. to 300° C.

The term "gas" is used in its broader sense of being either a pure gas or a mixture of several gases. In the art, oxidation during heating typically is conducted in an oxidizing gas ambient containing molecular oxygen, $O_2$. Oxygen for oxidation, however, may be present in other molecular forms in an oxidizing gas. The term "oxygen-containing" means that the relative amount of molecular oxygen present is not less than one volume-percent. The term "strong oxidizing gas" refers to a gas containing at least one volume-percent of a chemical species that is a stronger oxidant than oxygen.

The term "in the presence of water vapor", used herein in reference to crystallization annealing techniques, means that the volume-percent of water vapor in a gaseous atmosphere is in a range of from 1% to 40%, and preferably, at least 10%.

2. Description of Preferred Method

In general, some form of heating or annealing of a deposited metal-containing film in oxygen at elevated temperature is necessary for desired formation and crystallization of the desired metal oxide layered superlattice material. An important feature of embodiments of the invention is that the maximum temperature and the total heating times at elevated temperature are minimized compared to the prior art. In the embodiments described in detail in this specification, RTP and annealing treatments are conducted in oxygen-containing gas. The invention also includes, however, embodiments in which annealing in an oxygen-containing gas for part of the total time is followed by annealing in an unreactive gas.

Individual precursor compounds of a precursor solution for fabricating a layered superlattice material thin film may be selected from the group including metal beta-diketonates, metal polyalkoxides, metal dipivaloylmethanates, metal cyclopentadienyls, metal alkoxycarboxylates, metal carboxylates, metal alkoxides, metal ethylhexanoates, octanoates, and neodecanoates. Preferably, a metal precursor compound comprises a metal 2-ethylhexanoate, which is well suited for use in a liquid-source misted chemical deposition ("LSMCD") technique. An individual metal organic decomposition ("MOD") precursor compound is formed, for example, by interacting each metal of a desired compound, for example, strontium, bismuth, tantalum or niobium, or an alkoxide of the metal, with a carboxylic acid, or with a carboxylic acid and an alcohol, and dissolving the reaction product in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, and 2-pentanol. Solvents that may be used include xylenes, n-octane, n-butyl acetate, n-dimethylformamide, 2-methoxyethyl acetate, methyl isobutyl ketone, and methyl isoamyl ketone, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution. When using a liquid deposition technique, for example, spin-on or LSMCD, a metal 2-ethylhexanoate is a preferred precursor compound because the ethylhexanoates are stable in solution, have a long shelf life, form smooth liquid films, and decompose smoothly on a substrate. The ethoxyhexanoates and other metalorganic precursor compounds may be stored for periods of several months when dissolved in xylenes or n-octane.

Figure 3:
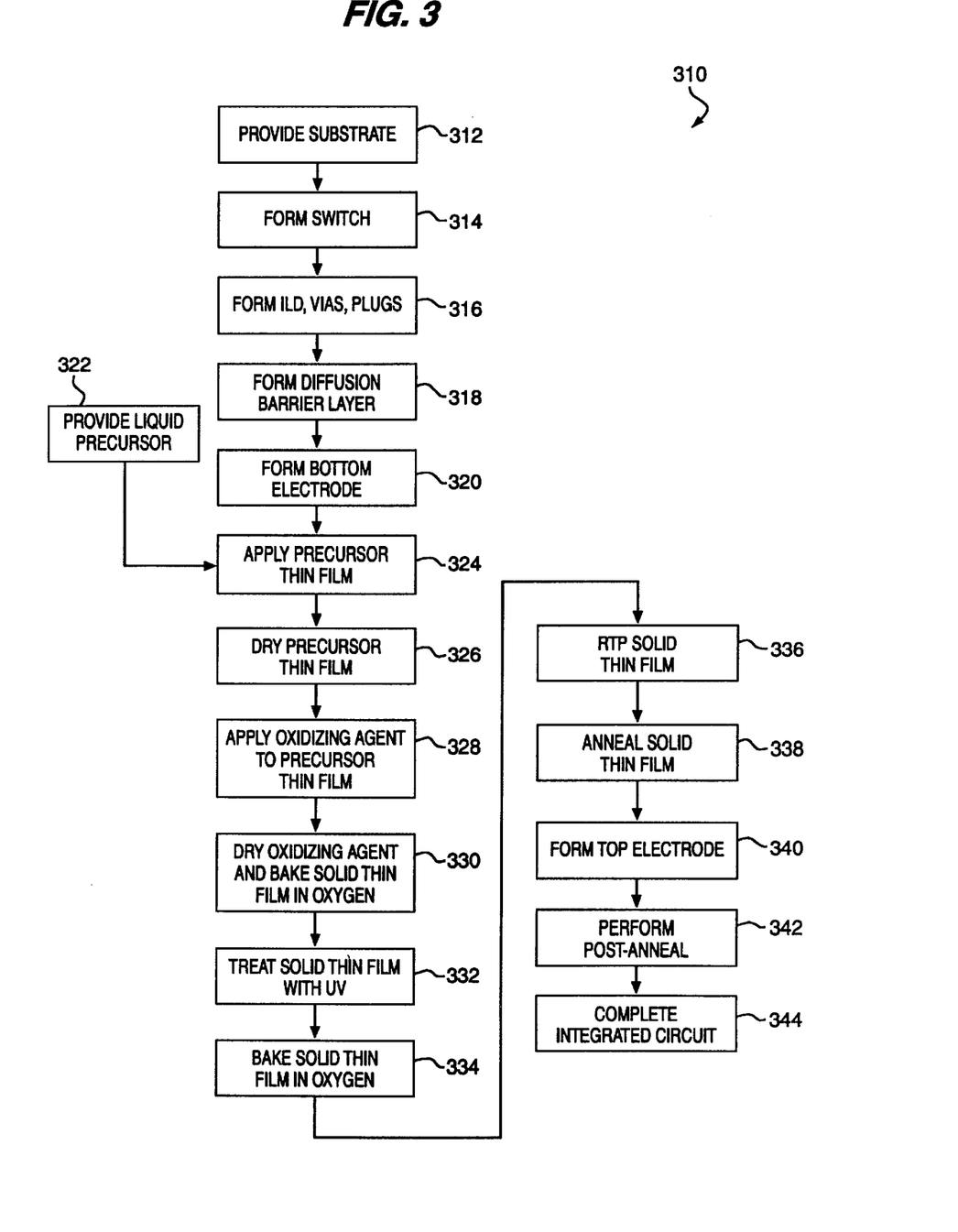
FIG. 3 is a flow chart of a preferred embodiment of a method for fabricating a thin film of layered superlattice material in accordance with the invention using a spin-coating technique.
Figure 4:
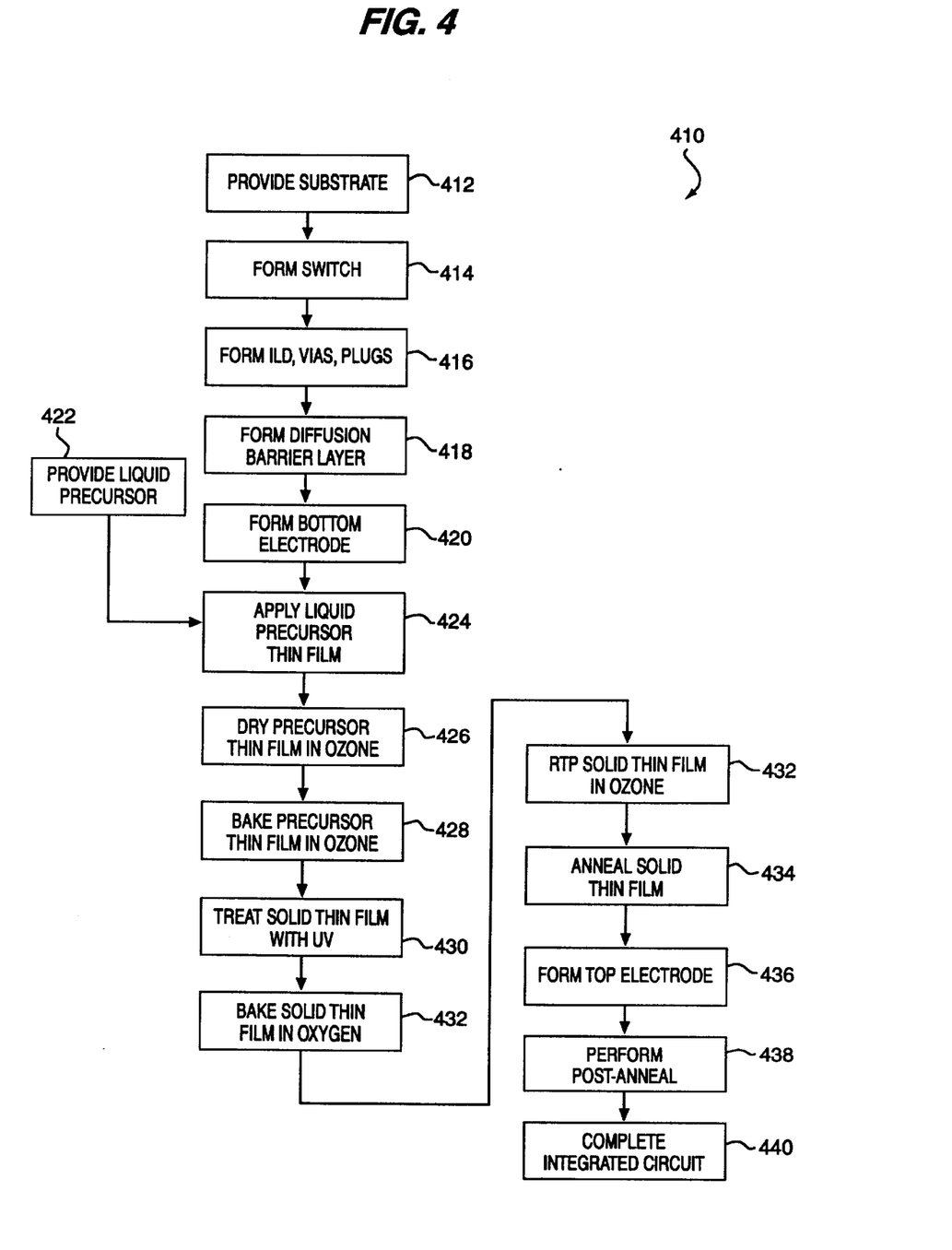
FIG. 4 is a flow chart of an alternative preferred embodiment of a method for fabricating a thin film of layered superlattice material in accordance with the invention using an LSMCD technique.

In accordance with the invention, the precursor may be applied to a substrate using a conventional liquid deposition technique, such as a misted deposition method as described in U.S. Pat. No. 5,456,945, or a spin-coating method. In the examples below, a liquid precursor coating was applied using a spin-coating technique. The diagrams of FIG. 3 and FIG. 4 are flow sheets of the fabrication steps of methods in accordance with the invention to make a ferroelectric memory as depicted in FIG. 1. The generalized method 310 of FIG. 3 uses a spin-coating technique. The generalized method 410 of FIG. 4 uses an LSMCD technique. Although methods 310 and 410 are discussed herein with reference to FIG. 1, it is clear that the methods of FIGS. 3 and 4 and numerous variations of methods in accordance with the invention may be used to fabricate thin films of polycrystalline layered superlattice materials of other compositions in various types of ferroelectric structures of the integrated circuit art.

In step 312 of FIG. 3, a semiconductor substrate is provided on which a switch is formed in step 314. The switch is typically a MOSFET. In step 316, an insulating layer is formed by conventional techniques to separate the switching element from the ferroelectric element to be formed. Using conventional processes, the insulating layer is patterned to form vias, which are filled with conductive plugs to electrically connect the switch to the memory capacitor and the rest of the integrated circuit. In step 318, a diffusion barrier layer is deposited on the insulating layer and patterned. Preferably, the diffusion barrier comprises titanium nitride and has a thickness of about 10 nm to 20 nm. Preferably, the diffusion barrier is deposited by a conventional sputtering method, using a titanium nitride target, although a titanium target with a nitrogen-containing sputter gas may also be used. In step 320, a bottom electrode is formed. Preferably, the electrode is made of platinum and is sputter-deposited to form a layer with a thickness of about 200 nm. In step 322, chemical precursors of the layered superlattice material that will form the desired ferroelectric thin film are prepared. Usually, precursor solutions are prepared from commercially available solutions containing the chemical precursor compounds. If necessary, the concentrations of the various precursors supplied in the commercial solutions are adjusted in step 322 to accommodate particular manufacturing or operating conditions. Preferred embodiments of the inventive method utilize a final liquid precursor solution containing relative molar proportions of the elements strontium, bismuth, tantalum and niobium corresponding approximately to $SrBi_2Ta_2O_9$ (SBT), $SrBi_2(Ta_{1-x}Nb_x)_2O_9$ (SBTN), where $0 \leq x \leq 1$, and particularly $Sr_aB_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$. A liquid coating of precursor solution is applied to the substrate in step 324. The precursor for forming the ferroelectric thin film of layered superlattice material is applied as a coating on the bottom electrode in step 324. In drying step 326, the substrate with the coating of liquid precursor is baked and dried at a low temperature, preferably not exceeding 300° C., and preferably being 100° C. or higher. Preferably, the drying step is conducted on a hot plate in substantially pure $O_2$ gas, or at least in an oxygen-containing gas, for a time period not exceeding 15 minutes. For example, after use of a spin-coating technique in Example 1, the liquid precursor thin film was dried using a hot plate at 160° C. for 1 minute, forming a solid precursor thin film.

In step 328, a liquid strong oxidizing agent in accordance with the invention is applied to the solid precursor thin film. In the preferred spin-on method, a 5% hydrogen peroxide solution of $H_2O_2$ in water is applied by spin-coating. In drying and baking step 330, the substrate including the solid precursor thin film and strong oxidation agent is dried and baked at a low temperature not exceeding 300° C., preferably on a hot plate at 160° C. for one minute, forming a solid metal oxide thin film. The step of exposing the precursor thin film to the strong oxidizing agent comprises the combination of steps 328 and 330. In step 332, an optional UV treatment is conducted. The solid metal oxide thin film is preferably treated with ultraviolet radiation ("UV") for 5 minutes at a wavelength from 150 nm to 350 nm, and preferably about 260 nm wavelength. In heating step 334, the solid metal oxide thin film is baked in oxygen-containing gas at low temperature. If optional UV step 332 was conducted, then heating step 334 preferably includes a hot plate bake at 160° C. for one minute, followed by a hot plate bake at 260° C. for 4 minutes. If optional step 332 was not performed, then, preferably, no 160° C. bake is done in step 334, rather only the 260° C. bake for 4 minutes is performed. Preferably, an RTP step 336 is conducted. The RTP treatment may be conducted in a conventional RTP apparatus. The RTP is conducted at a temperature in a range of from 500° C. to 700° C., for a time period in the range of from 5 seconds to 5 minutes. Preferably, the RTP is conducted at a temperature of 700° C. for 30 seconds with an actual ramping rate in a range of from 10° C. to 100° C. per second, preferably about 50° C. per second. Radiation from a halogen lamp, an infrared lamp, or an ultraviolet lamp provides the source of heat for the RTP step. In the examples below, an AG Associates model 410 Heat Pulser utilizing a halogen source at ambient atmospheric pressure was used. The RTP is performed in an oxygen-containing gas, preferably in substantially pure $O_2$ gas. Any residual organics are burned out and vaporized during the RTP process. At the same time, the rapid temperature rise of the RTP promotes nucleation; that is, the generation of numerous crystalline grains of layered superlattice material in the solid film resulting from steps 326 through 334. These grains act as nuclei upon which further crystallization can occur. The presence of oxygen in the RTP process enhances formation of these grains.

Anneal step 338 typically involves a furnace anneal of the solid metal oxide thin film at elevated temperature, preferably at 650° C. The furnace anneal in step 338 is performed in an oxygen-containing gas, usually $O_2$. Preferably, the annealing time of step 338 in oxygen does not exceed 90 minutes. The RTP of step 336 and the oxygen-annealing of step 338 can be conducted in air, in an oxygen-rich gas having an oxygen content greater than that of air, or in an "oxygen-deficient" gas, in which the relative amount of oxygen is less than the relative amount of oxygen in air. Preferably, they are performed in $O_2$ gas.

A top electrode is formed in step 340. Preferably, the electrode is formed by RF sputtering of a platinum single layer, but it also may be formed by DC sputtering, ion beam sputtering, vacuum deposition, or other appropriate conventional deposition process. If desirable for the electronic device design, before the metal deposition, the ferroelectric layered superlattice material may be patterned using conventional photolithography and etching, and the top electrode is then patterned in a second process after deposition. In the examples described below, the top electrode and layered superlattice material are patterned together using conventional photolithography techniques and ion beam milling.

As deposited, the adhesion of the top electrode to the thin film of layered superlattice material is usually weak. The adhesion is improved by post-annealing in step 342. The post-anneal may be performed in an electric furnace at a temperature between 500° C. and 700° C. A post-anneal below 500° C. does not improve the adhesion of the electrode, and the resulting capacitor devices would tend to be extremely leaky, and shorted in the worst cases. Preferably, post-annealing in step 342 is performed at 650° C.

The post-anneal, either a conventional furnace post-anneal for about 30 minutes to 60 minutes, or alternatively an RTP post-anneal for 5 seconds to 5 minutes, or both, releases the internal stress in the top electrode and in the interface between the electrode and the ferroelectric thin film. At the same time, the post-anneal step 342 reconstructs microstructures in the layered superlattice material resulting from the sputtering of the top electrode, and as a result improves the properties of the material. The effect is the same whether the post-anneal is performed before or after the patterning steps mentioned in connection with step 344 below. With regard to most electrical properties, unreactive gas, such as helium, argon, and nitrogen, may be used with approximately the same result as with oxygen, thereby decreasing exposure of the integrated circuit to oxygen at elevated temperature.

The circuit is generally completed in step 344, which can include a number of substeps; for example, deposition of an ILD, patterning and milling, and deposition of wiring layers.

FIG. 4 depicts a flowsheet of method 410, in which an LSMCD technique is used to deposit a precursor film, which is oxidized and treated in accordance with the invention. Steps 412 through 420 are similar to steps 312 to 320 in FIG. 3. In step 422, chemical precursors of the layered superlattice material that will form the desired ferroelectric thin film are prepared for misted deposition. Preferred embodiments of the inventive method utilize a final liquid precursor solution containing relative molar proportions of the elements strontium, bismuth, tantalum and niobium corresponding approximately to $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$. A liquid coating of precursor solution is applied to the substrate in step 424 using an LSMCD technique. An LSMCD technique is described in U.S. Pat. No. 5,997,642, issued Dec. 7, 1999, which is hereby incorporated bye reference as if fully contained herein. The precursor for forming the ferroelectric thin film of layered superlattice material is applied as a thin film coating on the bottom electrode in step 424. In drying step 426, the substrate with the liquid precursor thin film is dried in a strong oxidizing gas at a low temperature, preferably not exceeding 300° C. Preferably, drying step 426 is conducted on a hot plate in a gas mixture of 20 volume-percent ozone in $O_2$ gas at 160° C. for one minute. This is immediately followed by baking step 428, in which the substrate with the dried precursor thin film is heated at low temperature. Preferably, baking step 428 is conducted on a hot plate in a gas mixture of 20 volume-percent ozone in $O_2$ gas at 260° C. for four minutes. The step of exposing the precursor thin film to the oxidizing agent comprises steps 426 and 428.

In step 430, an optional UV treatment is conducted. The solid metal oxide thin film is preferably treated with ultraviolet radiation ("UV") for 5 minutes at 260 nm wavelength. Preferably, an RTP step 432 is also conducted. The RTP treatment may be conducted in a conventional RTP apparatus. The RTP is conducted at a temperature in a range of from 500° C. to 700° C., for a time period in the range of from 5 seconds to 5 minutes. Preferably, the RTP is conducted at a temperature of 700° C. for 30 seconds with an actual ramping rate in a range of from 50° C. to 100° C. per second, preferably about 50° C. per second, in a gas mixture of 20 volume-percent ozone in $O_2$ gas. Radiation from a halogen lamp, an infrared lamp, or an ultraviolet lamp provides the source of heat for the RTP step. Any residual organics are burned out and vaporized during the RTP process. At the same time, the rapid temperature rise of the RTP promotes nucleation; that is, the generation of numerous crystalline grains of layered superlattice material in the solid thin film resulting from steps 426 through 434. These grains act as nuclei upon which further crystallization can occur. The presence of oxygen in the RTP process enhances formation of these grains.

Anneal step 434 typically involves a furnace anneal of the solid metal oxide thin film at elevated temperature, preferably at 650° C. The furnace anneal in step 434 is performed in an oxygen-containing gas, usually $O_2$. Preferably, the annealing time of step 434 in oxygen does not exceed 90 minutes.

In a further embodiment, a conventional CVD apparatus and a CVD thin film deposition technique may be modified to fabricate a thin film in accordance with the invention. In one variation, strong oxidizing gas may be added to a CVD reaction chamber during deposition of a precursor thin film. Preferably about 20 volume-percent of ozone is maintained in the CVD reaction chamber, while the substrate is heated at elevated temperature, preferably at about 650° C. In another variation, instead of using strong oxidizing gas in the reaction chamber, a precursor thin film may be oxidized by using either a liquid or a gaseous strong oxidizing agent after CVD deposition of the precursor thin film, as described above.

In still another embodiment, the thin film is exposed to an oxygen-containing gas under a pressure higher than atmospheric pressure. The exposure to the pressure may occur during deposition, drying, baking or annealing. Preferably, the pressure is between two and ten atmospheres, and most preferably between two and five atmospheres.

Figure 5:
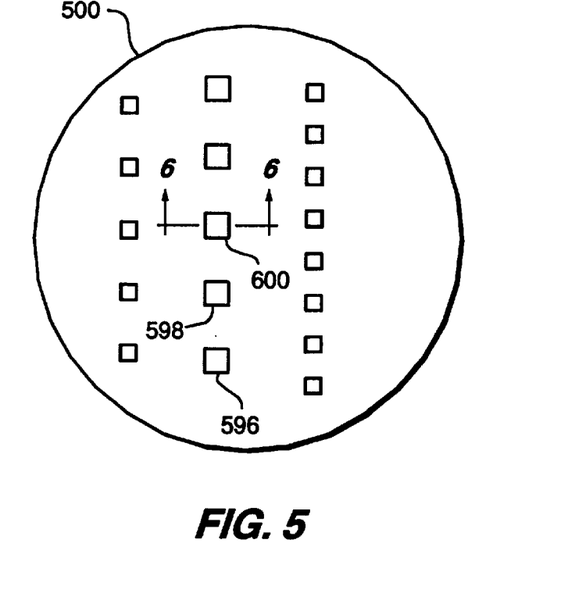
FIG. 5 is a top view of an exemplary wafer on which thin film capacitors fabricated in accordance with the invention are shown greatly enlarged.
Figure 6:
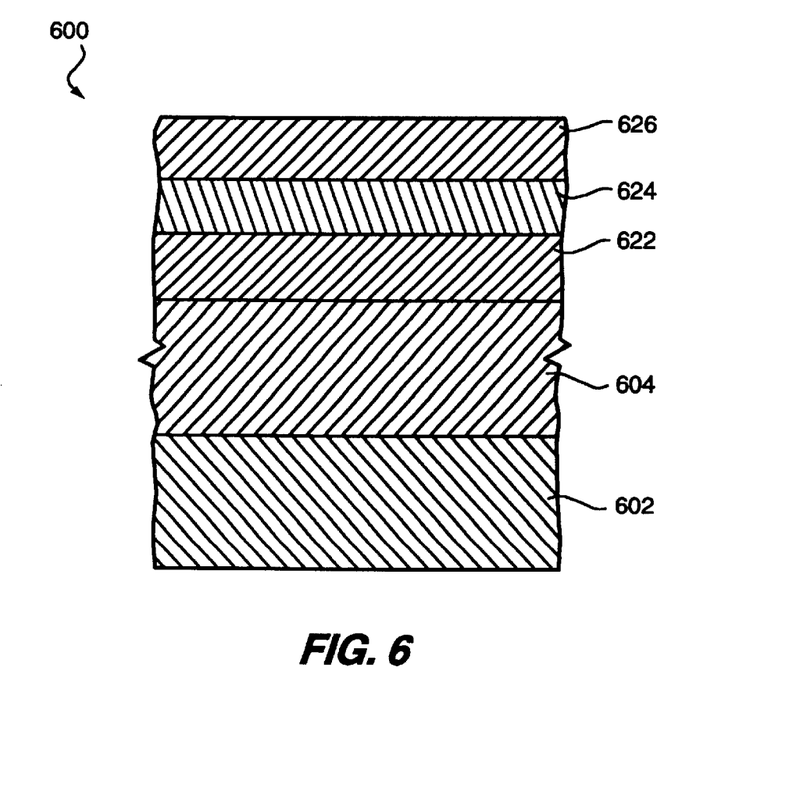
FIG. 6 is a portion of a cross-section of FIG. 5 taken through the lines 6—6, illustrating an exemplary thin film capacitor fabricated in accordance with the invention.

FIG. 5 is a top view of an exemplary wafer on which thin film capacitors 596, 598 and 600 fabricated on substrate 500 in accordance with the invention are shown greatly enlarged. FIG. 6 is a portion of a cross-section of FIG. 5 taken through the lines 6—6, illustrating a thin film capacitor device fabricated in accordance with the invention. A silicon dioxide layer 604 is formed on a silicon crystal substrate 602. Then bottom electrode 622 made of platinum is sputter-deposited on layer 604. Layer 624 is a ferroelectric thin film, and layer 626 represents the top electrode made of platinum.

In the examples below, the ferroelectric and electronic properties of strontium bismuth tantalate capacitors made according to the invention were studied by measuring hysteresis curves, polarizability, leakage current, and coercive field.

EXAMPLE 1

The capacitors were fabricated from a strontium bismuth tantalate (SBT) liquid precursor solution commercially available from the Kojundo Chemical Corporation. The solution contained amounts of chemical precursors corresponding to the stoichiometric formula $Sr_{0.9}Bi_{2.2}Ta_2O_9$. The 0.12 mol/l precursor solution contained: bismuth 2-ethylhexanoate, strontium 2-ethylhexanoate, and tantalum 2-ethylhexanoate. The capacitors were formed using one sequence of applying a precursor coating and strong oxidizing agent with corresponding heating steps, and the ferroelectric thin films had a thickness of about 95 nm.

A series of p-type 100 Si wafer substrates 602 were oxidized to form a layer of silicon dioxide 604. A bottom platinum electrode 622 with a thickness of about 200 nm was sputter-deposited on oxide layer 604. These were annealed 30 minutes in $O_2$ at 650° C., and dehydrated 30 minutes at 180° C. in low vacuum. A spincoat of the 0.12 molar solution of the SBT-precursor was deposited on the bottom electrode 622 at 1800 rpm for 30 seconds. This was dried by heating on a hot plate in $O_2$ gas for one minute at 160° C., forming a solid precursor thin film. In accordance with the invention, liquid strong oxidizing agent was applied to the precursor thin film on the wafer by spin-coating. Approximately 20 ml of 5% $H_2O_2$ in water was applied to the center of the wafer, spun at 500 rpm for 5 seconds, and then at 1500 rpm for 30 seconds. The spin-coating of strong oxidizing agent was dried and baked on a hot plate in $O_2$ gas at 160° C. for one minute, and then at 260° C. for 4 minutes. The resulting metal oxide thin film on the wafer was then treated using rapid-thermal-processing (RTP) at 700° C. for 30 seconds in $O_2$ gas, with a ramping rate of 100° C. per second. The wafer and coating were annealed for 90 minutes at 650° C. in an atmosphere of "wet" $O_2$ gas. The "wet" oxygen gas was produced by bubbling $O_2$ gas through water at 95° C. before flowing it into the annealing furnace. These steps formed a ferroelectric thin film 624 having a thickness of about 90 nm and containing strontium bismuth tantalate layered superlattice material. Platinum was sputter-deposited to make a top electrode layer 626 with a thickness of about 200 nm. The platinum and strontium bismuth tantalate layers were milled to form the capacitors, and then ashing was performed, followed by a post-anneal for 30 minutes at 650° C. in $O_2$ gas. The capacitors had a surface area of 7854 $\mu m^2$.

Figure 7:
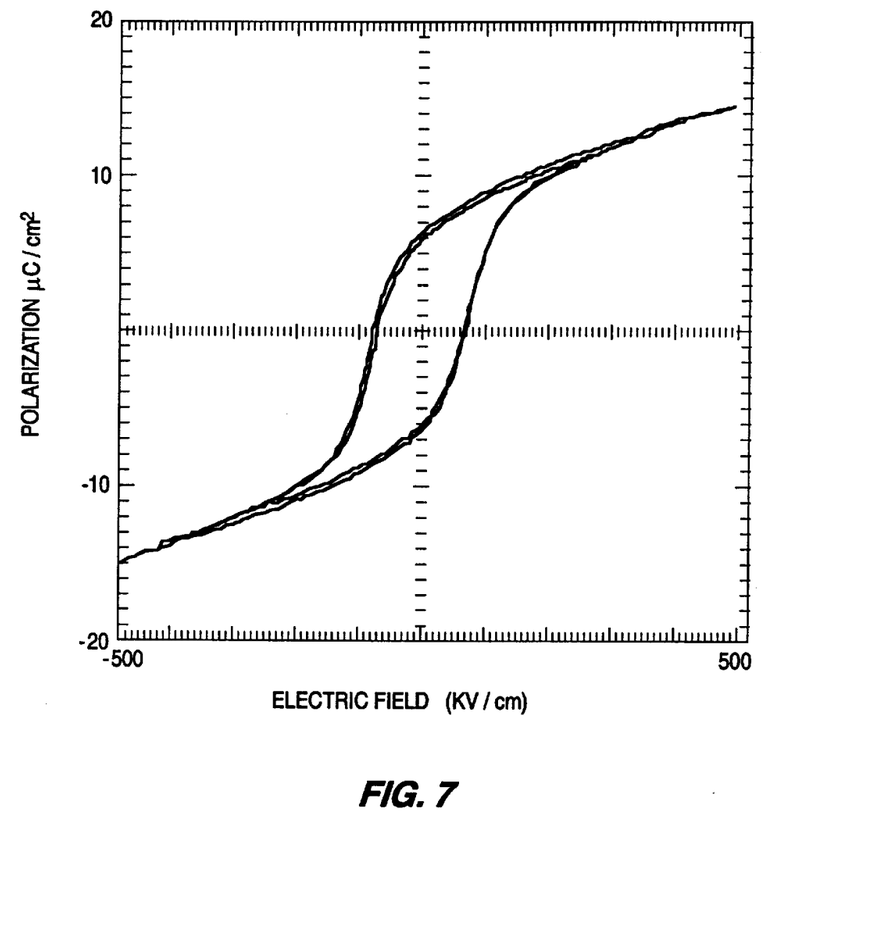
FIG. 7 is a graph of remanent polarization, 2Pr, in units of $\mu C/cm^2$, measured at 5 volts, plotted as a function of electric field strength, in an exemplary ferroelectric capacitor.

FIG. 7 shows the hysteresis curve of a representative sample capacitor measured at 5.0 volts, plotted on a graph of the polarization value, in units of $\mu C/cm^2$, as a function of applied field, in units of kV/cm. The measured remanent polarization, Pr, expressed as the 2Pr-value, was about 12.8 $\mu C/cm^2$ at 5 volts. The current density measured in this exemplary capacitor was only about $7 \times 10^{-7}$ A/cm² at 3 volts. The two-times coercive field value, 2Ec, was 143.6 kV/cm, measured at 5 volts.

EXAMPLE 2

SBT capacitors on a silicon wafer were fabricated in accordance with the invention as in Example 1, except the sequence of drying, exposing to a strong oxidizing agent, and baking were modified slightly. After application of the SBT-precursor coating, the liquid coating was dried at 160° C. for one minute, as in Example 1. Then, a baking step was performed at 260° C. for 2 minutes. After baking, approximately 20 ml of 5% $H_2O_2$ in water was applied, as in Example 1. The spin-coating of strong oxidizing agent was then dried and baked on a hot plate in $O_2$ gas at 260° C. for two minutes. The wafer was thereafter processed as in Example 1. The measured remanent polarization, Pr, expressed as the 2Pr-value, was about 11.9 $\mu C/cm^2$ at 5 volts. The current density measured in this exemplary capacitor was about $1.9\times10^{-6}$ $A/cm^2$ at 3 volts. The two-times coercive field value, 2Ec, was 162 kV/cm, measured at 5 volts.

EXAMPLE 3

SBT capacitors on a silicon wafer were fabricated in accordance with the invention using the sequence of drying, applying strong oxidizing agent, and baking, as in Example 2, except the furnace anneal of the ferroelectric thin film at 650° C. was conducted using dry $O_2$ gas, instead of "wet" oxygen gas as in Example 2.

The measured remanent polarization, Pr, expressed as the 2Pr-value, was about 12.2 $\mu C/cm^2$ at 5 volts. The current density measured in this exemplary capacitor was about $2.3\times10^{-7}$ $A/cm^2$ at 3 volts. The two-times coercive field value, 2Ec, was 166 kV/cm, measured at 5 volts.

It was previously believed that layered superlattice materials required heating treatments at elevated temperatures of at least 700° C., preferably higher, for a duration on the order of several hours. The good electronic characteristics achievable by heating a precursor thin film for short time intervals at low temperature in the presence of a strong oxidizing agent in accordance with the invention makes it possible to improve integrated circuit quality and to decrease fabrication costs by minimizing the time of exposure of the circuit to oxygen at elevated temperatures.

A feature of the invention is that the use of a strongly oxidizing agent or pressurized oxygen, particularly during the low temperature heating steps, suppresses formation of the non-perovskite, nonferroelectric fluorite phase in favor of the desired ferroelectric polycrystalline perovskite-like structure of a layered superlattice material.

There has been described a method using an oxidizing agent for making electronic devices containing layered superlattice materials and other novel aspects of making these materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. It is also evident that the steps recited may in some instances be performed in a different order; or equivalent structures and processes may be substituted for the various structures and processes described; or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of fabricating a thin film of layered superlattice material in an integrated circuit comprising the steps of:

providing a precursor containing metal moieties in effective amounts for forming a layered superlattice material upon heating said precursor;

wherein the layered superlattice material may be represented under the formula:

where A1, A2 . . . Aj represents A-site elements in the perovskite-like structure, S1, S2 . . . Sk represent superlattice generator elements; B1, B2 . . . Bl represent B-site elements in the perovskite-like structure; and Q represents an anion;

applying said precursor to a substrate to form a precursor thin film; and exposing said precursor thin film to a substance selected from the group consisting of: (a) a strong oxidizing agent; and (b) oxygen under pressure; to from a metal oxide thin film.

2. A method as in claim 1 characterized in that said strong oxidizing agent is a liquid.

3. A method as in claim 2 characterized in that said strong oxidizing agent comprises hydrogen peroxide.

4. A method as in claim 1 further comprising a step of heating said precursor thin film at a low temperature before said step of exposing.

5. A method as in claim 4 characterized in that said step of heating said precursor thin film at a low temperature includes drying said precursor thin film.

6. A method as in claim 5 characterized in that said step of drying is conducted at a temperature between 100° C. and 300° C.

7. A method as in claim 5 characterized in that said step of drying is conducted at a temperature of 160° C.

8. A method as in claim 1 characterized in that said strong oxidizing agent is a gas.

9. A method as in claim 8 characterized in that said strong oxidizing agent comprises ozone.

10. A method as in claim 1 characterized in that said step of exposing comprises heating said precursor thin film in a gaseous atmosphere containing said strong oxidizing agent.

11. A method as in claim 10 characterized in that said step of heating is conducted at a temperature not exceeding 300° C.

12. A method as in claim 9 characterized in that said step of heating comprises a drying said precursor thin film.

13. A method as in claim 12 characterized in that said step of drying is conducted at 160° C.

14. A method as in claim 1 further comprising a step of annealing said metal oxide thin film at elevated temperature in a range of from 500° C. to 700° C.

15. A method as in claim 14 characterized in that said elevated temperature does not exceed 650° C.

16. A method as in claim 14 characterized in that said step of annealing is conducted for a time period in a range of from 30 minutes to two hours.

17. A method as in claim 14 characterized in that said step of annealing is conducted in an oxygen-containing atmosphere.

18. A method as in claim 17 characterized in that said oxygen-containing atmosphere includes water vapor.

19. A method as in claim 14 further comprising a step of treating said metal oxide thin film with ultraviolet (UV) radiation before said step of annealing.

20. A method as in claim 19 characterized in that said ultraviolet radiation has a wavelength of from 150 nm to 350 nm.

21. A method as in claim 1 further comprising a step of conducting an RTP at elevated temperature in a range of from 500° C. to 700° C.

22. A method as in claim 1 wherein said pressure is 1.25 atmospheres or more.

23. A method of fabricating a thin film of layered superlattice material in an integrated circuit comprising steps of:

providing a precursor containing metal moieties in effective amounts for forming a layered superlattice material upon heating said precursor;

wherein the layered superlattice material may be represented under the formula:

$$A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q z^{-q}$$

where A1, A2 . . . Aj represents A-site elements in the perovskite-like structure; S1, S2 . . . Sk represent superlattice generator elements; B1, B2 . . . Bl represent B-site elements in the perovskite-like structure; and Q represents an anion;

applying said precursor to a substrate to form a metal oxide thin film; and heating said precursor or said metal oxide thin film in the presence of water vapor to form said thin film of layered superlattice material.

24. A method as in claim 23 wherein said step of heating comprises heating in an atmosphere of wet oxygen gas.

25. A method as in claim 24 and including a step of bubbling oxygen gas through water to provide said wet oxygen gas.

26. A method as in claim 25 wherein said water is heated during said step of bubbling.

27. A method as in claim 26 where said water is heated to a temperature of 75° C. or higher.

28. A method as in claim 23 wherein said step of heating comprises annealing at a temperature of from 500° C. to 700° C.

* * * * *